United States Patent [19]

Anderson et al.

[11] Patent Number: 4,791,721
[45] Date of Patent: Dec. 20, 1988

[54] SINGULATION SYSTEM FOR PRINTED CIRCUIT BOARDS

[75] Inventors: William N. Anderson, Highland Park; Thomas G. Anderson, Mundelein, both of Ill.

[73] Assignee: Wand Tool Company, Wheeling, Ill.

[21] Appl. No.: 16,352

[22] Filed: Feb. 19, 1987

[51] Int. Cl.4 ............................................. H05K 3/00
[52] U.S. Cl. ...................................... 29/829; 29/830; 29/847
[58] Field of Search ................ 29/832, 829, 830, 847; 83/685, 691

[56] References Cited

U.S. PATENT DOCUMENTS 3,982,458 9/1976 Terasaka ............................... 83/685
4,096,774 6/1978 Kaufmann ............................. 83/691

Primary Examiner—Carl E. Hall
Assistant Examiner—Taylor J. Ross
Attorney, Agent, or Firm—Laff, Whitesel, Conte & Saret

[57] ABSTRACT

A singulation system wherein a multiplicity of circuit board members, or the like, can be fabricated by assembling components in a predetermined array on a large planar board-like member with portions of the large member defining independent circuit board assemblies which are separated from each other by intervening slots. The system includes readily adjustable punch and die plate members and accomodating platens which accomplish separation of the independent board assemblies from the large board arrangement without damage to the components mounted thereon.

13 Claims, 4 Drawing Sheets

SINGULATION SYSTEM FOR PRINTED CIRCUIT BOARDS

This invention relates to a singulation system wherein a large planar board-like member is provided with a plurality of devices that are associated on and with said member in a predetermined array. Portions of said member may be separated from adjacent portions by slot-like means and maintained initially as a single unit by integral connector break-away tab means or the like. As part of the contemplated system, means are provided that are capable of punching out the break-away tab means to provide discrete individual portions that are individually functional, such separation being carried out without damage to the devices assembled thereon.

BACKGROUND OF THE INVENTION

In the art of printed circuit boards and the like, it has become state of the art to have automatic machine insertion and assembly of components with the printed circuit boards by means of computer controlled equipment. A plurality of differing parts are stocked and installed at a single station. The greater the nunber of components that can be installed at a single station increases productivity by eliminating the necessity of providing additional stations and assembly equipment for each station.

Previously, circuit boards that were produced as being parts of an initially large board had to be broken apart before the components were attached to it to prevent damage to the components. This increased the amount of handling necessary to complete such assemblies since each individual board required separate handling during the assembly process.

SUMMARY AND OBJECT OF THE INVENTION

A primary object of the present invention is to provide a singulation system usable in an environment wherein a plurality of printed circuit boards are laid out on a single large planar board means and into which components can be assembled in a predetermined array. Each of the portions of the large board means that are capable of forming an individual circuit board are initially interconnected by suitable means to the next adjacent portion thereof. Thus, a single station of an assembly machine can be utilized to insert a plurality of components on each portion of the large board.

A further object of the present invention is to provide a system wherein the individual portions are interconnected by a plurality of small break away or frangible tab areas whereby the portions carrying components assembled thereto can be separated into discrete individual printed circuit boards without damaging the components assembled on each singulated board.

Another object of the present invention is to provide a die assembly adapted to separate a plurality of individual circuit boards from an original single large board without damage to the components.

Still another object is to provide a die assembly in which die packages can be readily interchangeable in a five to ten minute time span to accommodate a variety of board sizes and which can be quickly "set-up".

Further objects of the present invention include the provision of safety features for introduction of the interconnected boards at a position removed from within the stroke of the platens carrying the die plates. Safety switch means are provided for insuring proper positioning of the die plates and removal of operators hands prior to activation of the die platens.

Other objects will become apparent to those skilled in the art when the accompanying specification is read in conjunction with the attached drawings, wherein.

Figure 1:
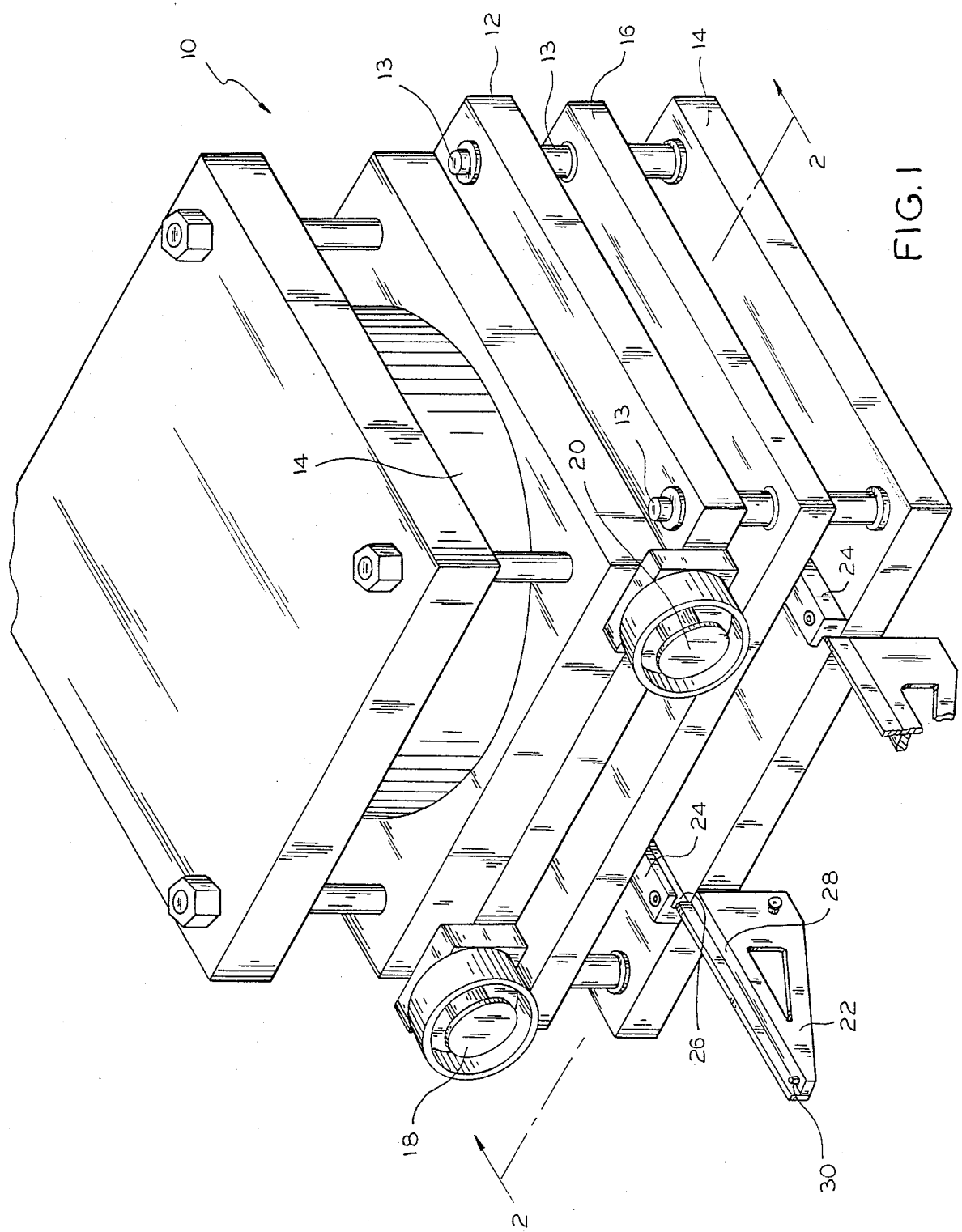
FIG. 1 is a perspective view, partially fragmented, of an embodiment of the present invention.

Referring now to the accompanying drawings, and particularly FIG. 1, wherein similar parts are designated by similar numerals, a press 10, of the type generally contemplated, can be either pneumatically or hydraulically operated, dependent upon the force necessary to carry out the punching operation required. Such a press normally includes a frame 12 supporting a power ram cylinder 14 by means of guide posts 13 fixed to the base or bottom platen 14. The guide posts 13 normally accommodate the upper or moveable platen 16 that is carried on and moved by the end of a piston or ram, to be discussed later, that is activated by the lower cylinder 14. The lower platen 16 carries a pair of tracks 24 having opposing undercuts 26 which are adapted to accommodate a sliding lower die plate, not shown in FIG. 1, for loading the workpiece under the power operated upper platen 16. A pair of loading racks 22 are positioned with their upper surfaces 28 aligned in coplanar relation to the upper surface of lower platen 14 and its rails 24 for accepting the lower die plate during loading operations. A stop means 30 is provided on each rack surface 28 adjacent its distal end to prevent excessive outward travel of the lower die plate, not shown in FIG. 1.

Figure 2:
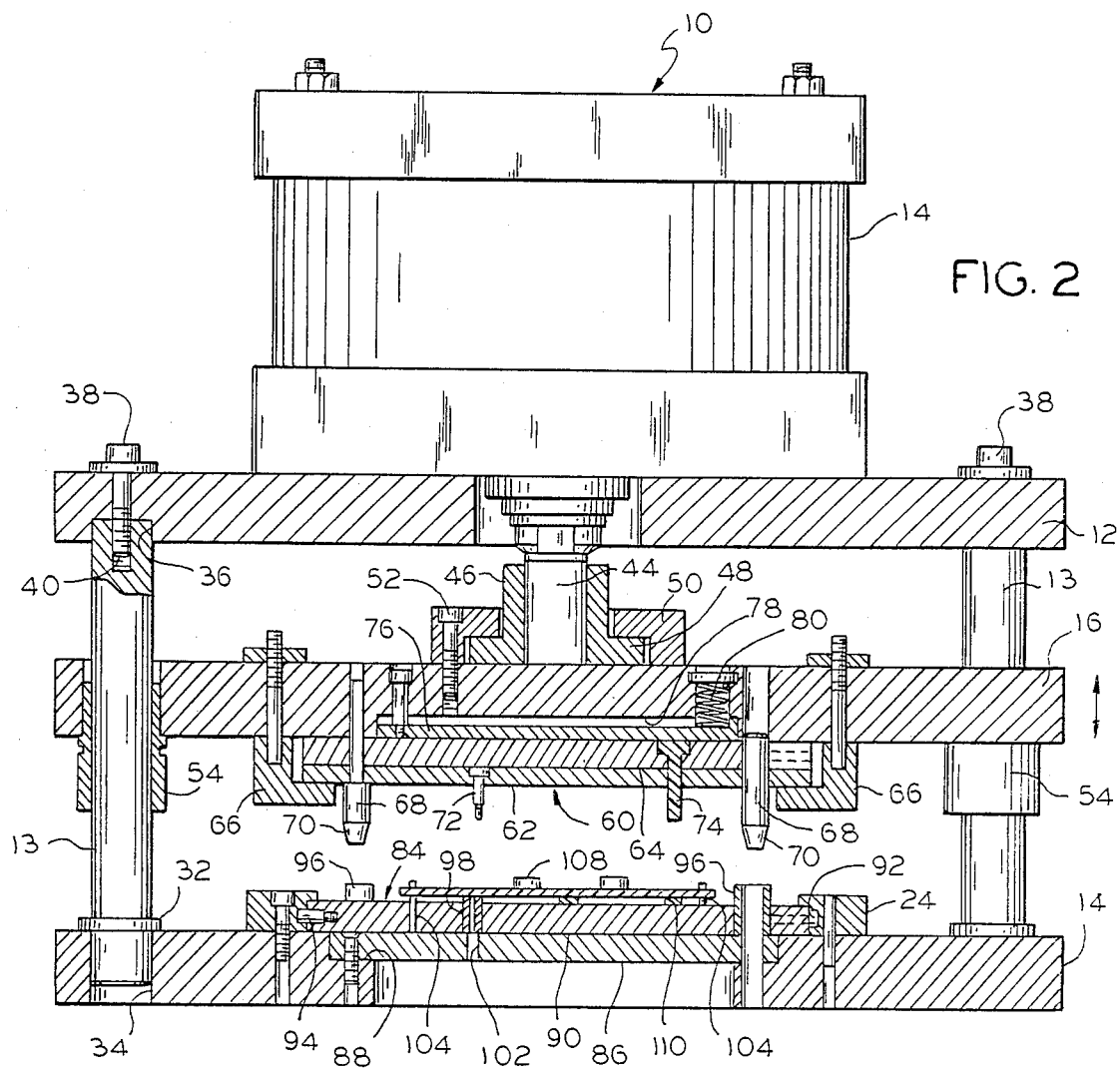
FIG. 2 is an elevational view, in partial section, as taken generally along line 2—2 of FIG. 1.

Referring now to FIG. 2 et seq, the frame 12 is maintained in spaced relation to the base or bottom platen 14 by known guide posts or rails 13. As can be seen in FIG. 2, the lower end of post 13 is provided with a shoulder-like means 32 which limits its lower progress when inserted into the bore 34. Preferrably there are four posts 13, one at each corner. The upper end is fitted into a counterbore 36 in frame 12 and secured by a fastener or bolt 38 received in the threaded bore 40, as is well known in the art.

The upper frame 12 supports the power unit or cylinder 14 and depending therefrom is the arm or piston 44, which can be either a single piston of limited stroke or a plurality of concentric cylindrical members giving a variable stroke, as is known in the art. Fastened on the end of the ram 44 is a sleeve 46 having a laterally extending flange 48. A casing or yoke 50 encases flange 48 and is fastened by suitable means, such as screw 52, to the moveable platen 16 whereby movement of the ram 44 in a vertical direction, as seen in the drawing, results in movement of the platen 16. Appropriate sleeve or ball bearings 54 surround and ride on the guide posts 13 and being fixed to moveable platen 16 insure uniform parallel movement of platen 16 relative to the fixed platen or base 14 when subjected to the reciprocating force of ram 44 during its predetermined stroke.

The press 10 for this system provides quickly changeable die plates including an upper punch retaining plate assembly 60 and a lower die plate and shuttle assembly 86. For clarity of illustration there may be only a single representation of a particular item shown in FIG. 2 when in actuality there probably will be a plurality of each item arranged around a circuit board being singulated.

The upper punch retaining assembly 60 includes a pair of plates 62-64 suitably joined together and maintained in mounted relation to moveable platen 16 by quick clamp means 66 with accurate positionment controlled by guide pins 68, the latter having tapered ends 70. Extending downwardly in fixed relation from plates 62-64 are one or more punches 72, preferably formed of a hardened material such as high carbon high speed steel, or the like. Also extending downwardly in a resiliently moveable manner are one or more plastic hold down buttons 74 which initially extend further downwardly, as seen in FIG. 2, than do the rigid punches 72. The buttons 74 include a head 76 moveable upwardly against the spring loaded plate 76 that is positioned within counterbore 78 and spring biased by one or more springs 80.

The cooperating lower die assembly 84 includes a support plate 86 mounted in a recess 88 of the lower fixed platen 14. Positioned above the support plate 86 and extending beyond its lateral extremities is the slide or shuttle 90 moveable within the undercut of the tracks 24. The interior of each track 24 includes a longitudinal slot 92 through a portion of its length, while shuttle 90 carries a complimentary means, such as a shoulder screw 94, for limiting the travel of shuttle 90 to the extent of slot 92, and/or in at least one direction the movement of shuttle 90 will be controlled by the disposition of stop means 30 on the loading racks 22.

The shuttle 90 also carries a plurality of guide bushings 96, equal in number to guide pins 68, for insuring proper alignment of shuttle 90 with the cooperating elements of assembly 60. The shuttle or die plate 90 further includes at least one hardened die bushing 98 having an internal bore 100 complimentary to the shape of punch 72. A waste bore hole 102 is provided in support plate 86 below each die bushing 98 to accept scrap developd during the punching operation. One or more locating means, such as upwardly extending pins 104, are used to mate with suitable means, such as apertures 105, to properly orient and position the workpiece 106, in the present example a circuit board, carrying components 108 mounted on either the upper or lower surface thereof. A plurality of pad-like members 110 are disposed in a predetermined array to support the circuit boards in spaced relation to the shuttle or die plate 90, with there being at least one pad located under the circuit board adjacent to the location where it is contacted by a hold down button 74. The vertical dimension of each pad is determined by the configuration of each assembly being handled and whether the assembly includes components located on the lower surface of the workpieces. Additionally, the pads' upper extremities should fall in a common plane substantially equal to the planar disposition of the upper extremity of the die bushings 98, thereby insuring adequate support of the workpiece during the punching operation. It has been found that urethane is a desirable material for the hold down buttons 74 and pads 110.

Figure 3:
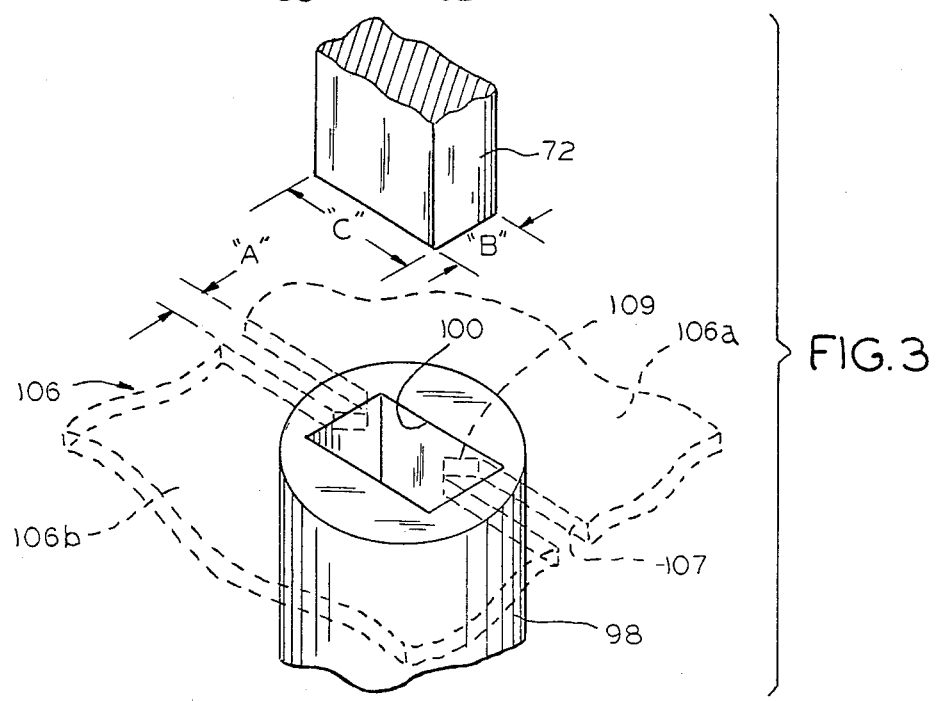
FIG. 3 is an exploded perspective view, in partial section, of a punch and die bushing showing their general interaction with a workpiece segment shown in phantom.
Figure 4:
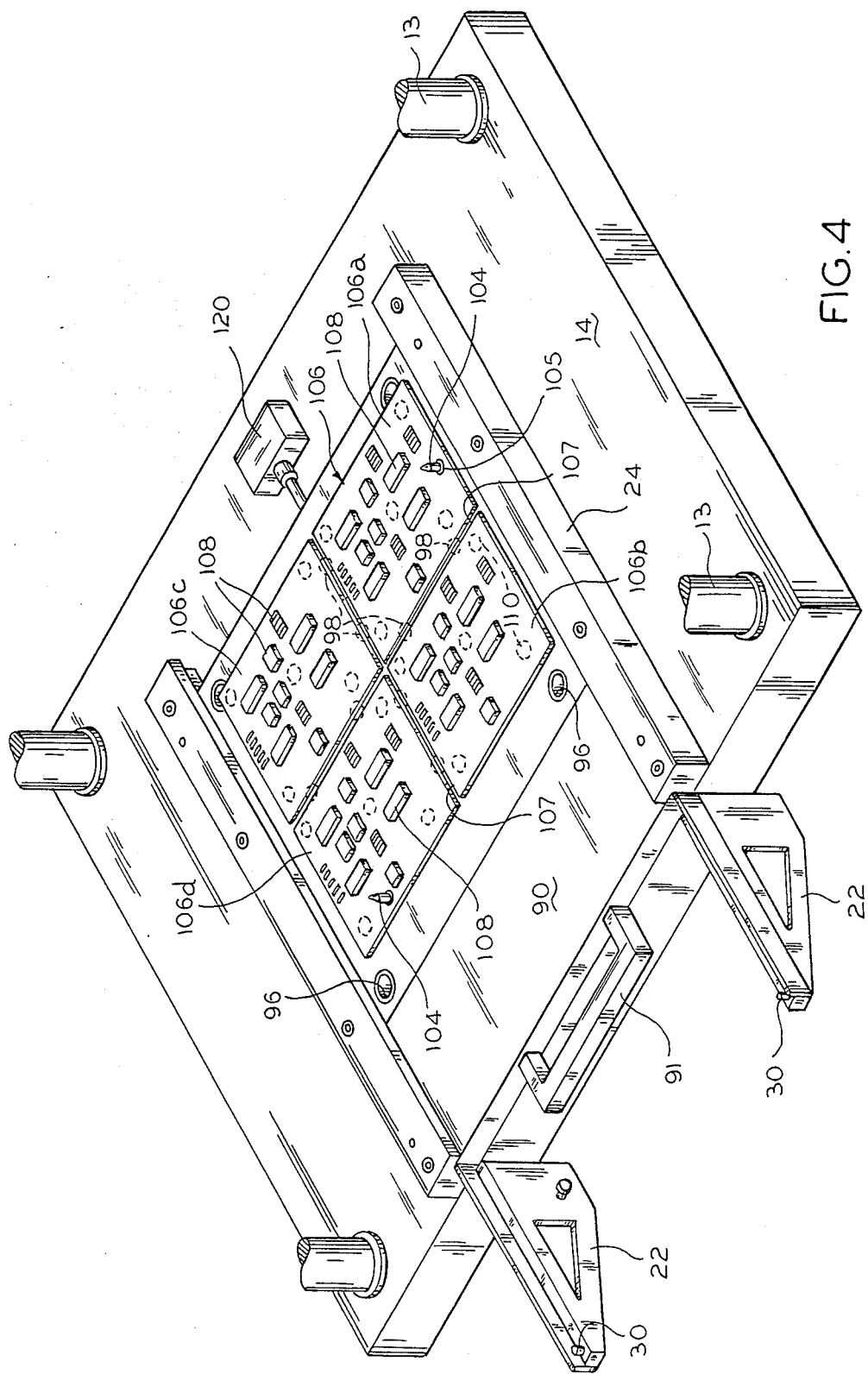
FIG. 4 is a partial perspective view of the lower platen of the embodiment of the present invention showing an exemplary circuit board in position for singulation.

Referring now to FIG. 4, the bottom die plate or shuttle 90 includes means for moving it within the confines of rails 24, in this embodiment a handle 91. It will be appreciated that automatic transfer means, not shown, can be utilized for loading and unloading of the workpiece. A switch 120 is disposed at the rear of base platen 14 and is serially connected to the safety switches 18-20 to insure that the shuttle 90 is properly positioned before the ram 44 can be activated. The tapered end 70 of guide pins 68 can adjust the positionment of shuttle 90 to insure alignment of the two die plate assemblies and particularly the hardened punch 72 with bore 100 of die bushing 98. Merely as an example of the present invention and not for purposes of limitation, the workpiece 106 shown in FIG. 4 includes four portions 106a, 106b, 106c and 106d which are to be singulated by this system. The break-away tab areas 109 are located at spaced points along the slots 107 and are positioned over the die bushings 98, shown in phantom. As can be seen in the enlarged exploded view of FIG. 3, the slot 107 has a finite width "A" and the break-away tab area has a similar width of material extending between the points designated by the numeral 109, as shown in phantom for clarity in illustration. The end of punch 72 has a length "C" adequate to extend beyond the points designated by the numeral 109 and a width "B" sufficient to insure separation of the two portions 106a and 106b from one another. In the illustration the width "B" of punch 72 is shown as being greater than the width of slot 107, however, the preferrable size would be for width "A" and width "B" to be substantially identical to provide a smooth edge to each of the independent portions, 106a, 106b, etc.

It will be noted that the punch 72 has an enlarged body portion positioned above the actual illustrated rectangular configuration. This enlarged section can serve as a positive stop means to limit the stroke of ram 44 and the moveable platen 16. Similarly, separate stop means, not shown, can be employed to provide a secondary safety means to insure that the stroke of ram 44 does not extend too far and result in damage to the mounted components 108. However, such a separate stop means is built into the present invention in the form of the hold down buttons 74 when confronted by the spring loaded metal pressure pad 76, the latter's movement being limited by the depth of the counterbore 78. Thus, the use of urethane material for the buttons 74 and pads 110 provides a cushioning effect to the stop means.

Figure 5:
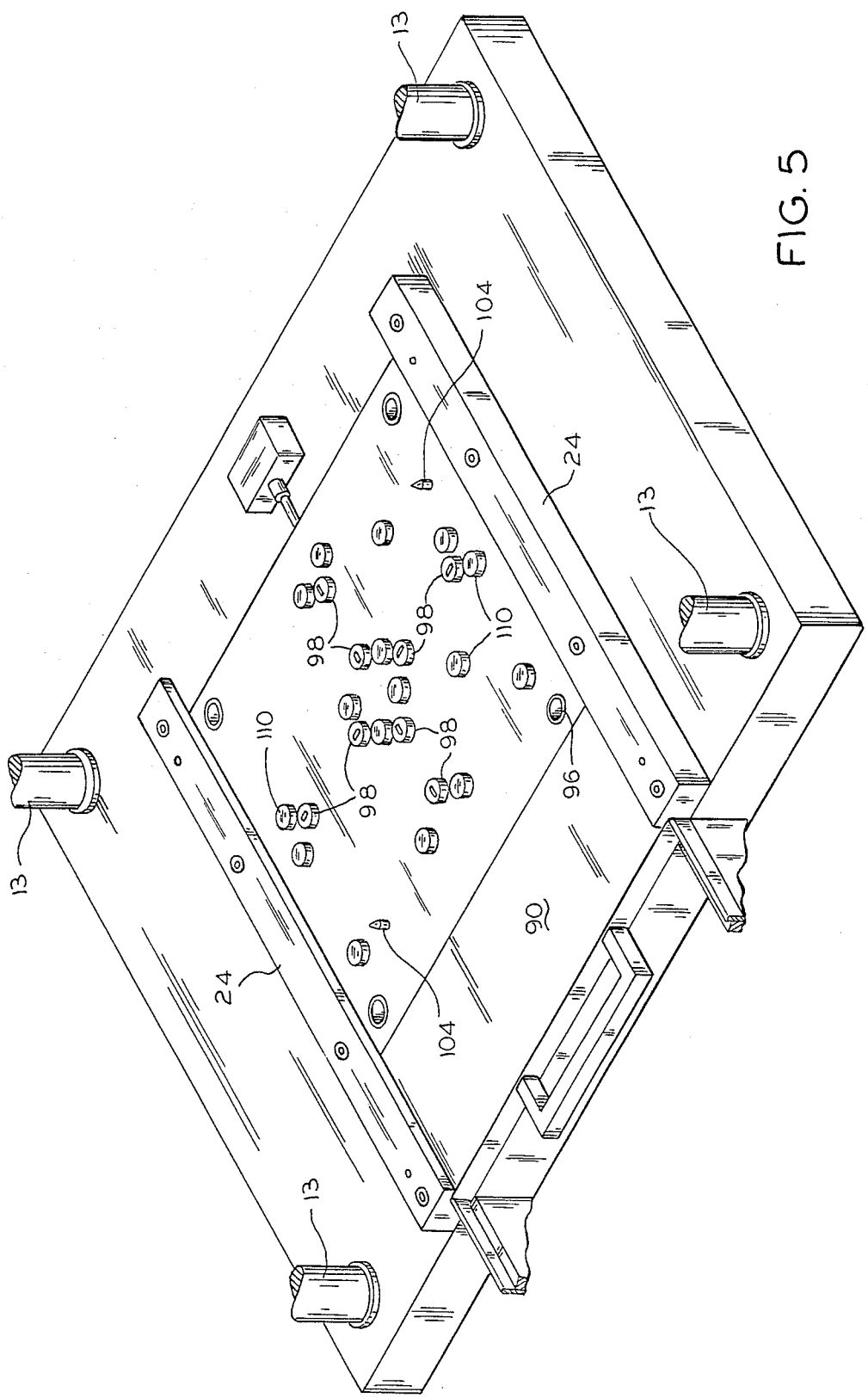
FIG. 5 shows the lower platen with die means in place but with the exemplary circuit board shown in FIG. 4 removed for clarity.

FIG. 5 is provided to give a clearer view of the platen 14 and its associated shuttle 90 with the workpiece 106 removed to expose guide bushings 96, die bushings 98, locating pins 104 and support buttons 110.

Other embodiments will be become apparent to those skilled in the art and should be construed by the attached claims.

We claim:

1. A singulation system to be used in a press-like mechanism for the production of a plurality of planar disposed assemblies, said system including at least one initially unitary large planar board-like workpiece, a multiplicity of components assembled and mounted in a predetermined array on at least two adjacent substantially co-planar portions of said workpiece, slot means substantially separating said at least two portions of said workpiece, integral means intersecting said slot means and interconnecting said at least two portions of said workpiece, and an interchangeable die means mounted in said press-like mechanism and adapted to accept and operate on said integral means of said at least one planar workpiece to separate said at least two portions of said workpiece into at least two discrete individual independent board means all being subsequent to the assembly and mounting of said components on said initially unitary workpiece.

2. A singulation system of the type described in claim 1 wherein said planar workpiece is relatively thin in relation to its height and width.

3. A singulation system of the type described in claim 1 wherein said unitary workpiece initially includes identical arrays of components on each said portion.

4. A singulation system of the type described in claim 1 wherein said unitary workpiece initially includes assymetrical arrays of dissimilar components on at least two of said portions.

5. A singulation system of the type described in claim 1 wherein each said die means includes a pair of readily removable cooperating die plates mounted respectively on an upper movable platen and a lower fixed platen, each of said pair of die plates being configured for accepting a predetermined one of said unitary workpieces.

6. A singulation system of the type described in claim 5 wherein said die plate mounted on said upper moveable platen includes a plurality of die punches each arranged in a predetermined location to correspond with and be located over one of said interconnecting means on said planar unitary workpiece portions when such a workpiece is positioned relative to said lower fixed platen which is adapted to carry a plurality of complementary die bushings each arranged in one of said predetermined locations, whereby said die punches are capable of punching away said interconnecting means when said upper platen is moved relative to the fixed platen to thereby separate said portions without damaging the components mounted thereupon.

7. A singulation system of the type described in claim 6 wherein said upper platen and said lower fixed platen include a series of floating alignment pins and bushings for guiding said upper platen during its downward movement to bring said die punches into contact with said interconnecting means, said interconnecting means each including a reduced width tab area which extends between said workpiece portions and extends the width of said slots, whereby the die punches are adapted to break away or cut through and thereby separate said portions of the planar unitary workpiece into discrete independent portions.

8. A singulation system of the type described in claim 7 wherein said lower platen includes support means for supporting the workpiece in spaced relation thereto and thereby prevent damage to any assembled components extending downwardly from the underside of said workpiece.

9. A singulation system of the type described in claim 8 wherein said platens are provided with means whereby said upper platen is maintained in spaced relation to said lower platen at all times and thereby prevented from contacting and damaging components mounted on the upper side of said workpiece.

10. A singulation system of the type described in claim 9 wherein said lower platen includes means for moving said lower platen laterally relative to said upper platen whereby the said unitary workpiece may be positioned over said lower platen in a safe location removed from said upper vertically moveable platen.

11. A singulation of the type described in claim 10 wherein said means for moving said lower platen include a pair of side rails for restraining movement of said lower platen other than in a predetermined sliding path to thereby permit insertion and removal of each said workpiece and said portions thereof into and out of from below said upper platen punch area to insure a wide safety factor in the operation of the system.

12. A singulation system of the type described in claim 11 wherein said system includes switch means responsive to proper positionment of said lower platen to prevent operation of the system until the lower platen is in its proper position.

13. A singulation system of the type described in claim 12 wherein each of said planar workpiece portions is a circuit board and the assembled and mounted components are electronic in nature.

* * * * *